United States Patent [19]
Hermann

[11] Patent Number: 5,196,758
[45] Date of Patent: Mar. 23, 1993

[54] HIGH FREQUENCY PIEZOELECTRIC RESONATOR

[75] Inventor: Jean Hermann, Neuchatel, Switzerland

[73] Assignee: Centre Suisse D'Electronique et de Microtechnique S.A., Switzerland

[21] Appl. No.: 666,641

[22] Filed: Mar. 8, 1991

[30] Foreign Application Priority Data

Mar. 8, 1990 [CH] Switzerland .................. 00738/90

[51] Int. Cl.$^5$ .................................. H01L 41/08
[52] U.S. Cl. .............................. 310/361; 310/366; 310/367
[58] Field of Search ............. 310/361, 366, 367, 346

[56] References Cited

U.S. PATENT DOCUMENTS

| 4,450,378 | 5/1984 | Hermann et al. | 310/367 X |
| 4,469,979 | 9/1984 | Chuang | 310/367 X |
| 4,654,663 | 3/1987 | Alsenz et al. | 310/367 X |
| 4,873,465 | 10/1989 | Bourgeois | 310/361 |
| 4,926,086 | 5/1990 | Bourgeois et al. | 310/368 X |

FOREIGN PATENT DOCUMENTS

| 0096653 | 12/1983 | European Pat. Off. . |
| 0350443 | 1/1990 | European Pat. Off. . |
| 0039391 | 3/1977 | Japan ............... 310/367 |

OTHER PUBLICATIONS

Proceedings of the 39th Annual Frequency Symposium 1985, Philadelphia, Pa., IEEE. Catalog No. 85CH2186-5, Library of Congress No. 58-60781, May 29-31, 1985, "A Novel Miniuature ZT-Cut Resonator", J. W. Herman, pp. 375-380.

Patent Abstracts of Japan, vol. 6, No. 32 (E-96)(910), Feb. 28, 1982, 56-152313.

*Primary Examiner*—Mark O. Budd
*Attorney, Agent, or Firm*—Parkhurst, Wendel & Rossi

[57] ABSTRACT

A piezoelectric resonator containing two rectangular parallelepipedal slices including N and M base structures, respectively, wherein N and M are integers. The two rectangular parallelepipedal slices each include at least one base structure shaped as a thin crystal slice of piezoelectric material in the form of a rectangular parallelepiped. A non-resonant arm connects the two rectangular parallelepipedal slices in juxtaposition in a single plane. An embedding zone is connected to the arm through a connection zone so as to fix the resonator outside a center thereof. Electrodes are disposed on opposite surfaces of the two rectangular parallelepipedal slices and are polarized to excite preferentially the Nth harmonic of a fundamental contour vibration mode in each base structure, and to produce respective extension modes in the two rectangular parallelepipedal slices in a direction perpendicular to an axis of the non-resonant arm.

2 Claims, 2 Drawing Sheets

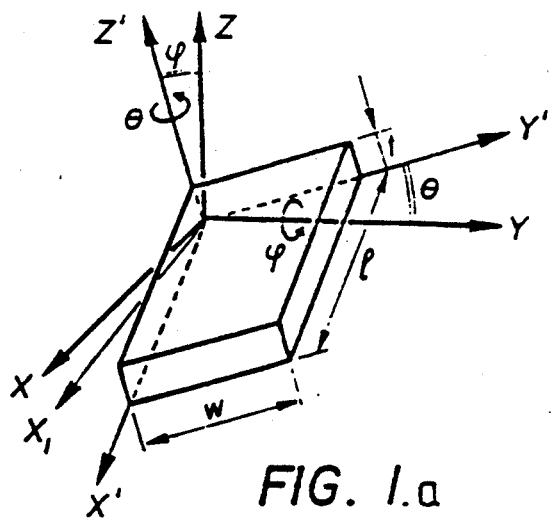
FIG. 1.a
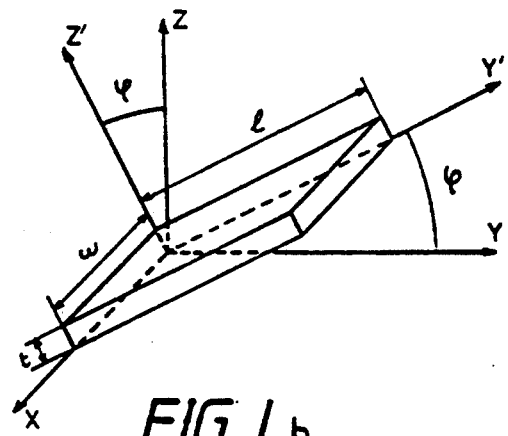
FIG. 1.b
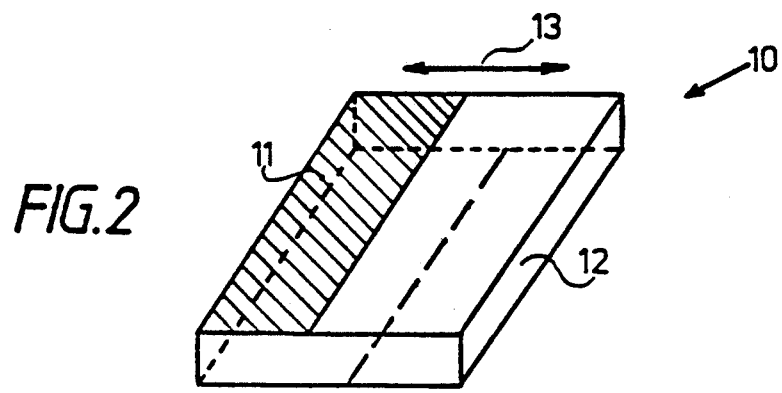
FIG. 2
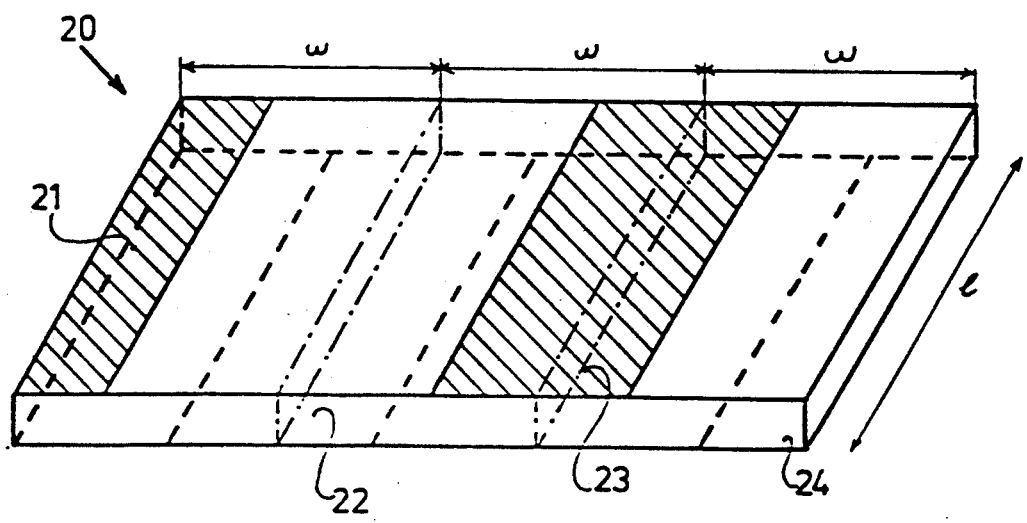
FIG. 3

HIGH FREQUENCY PIEZOELECTRIC RESONATOR

FIELD OF THE INVENTION

The present invention relates to a high frequency piezoelectric resonator, vibrating according to a contour mode, and having a characteristic curve of frequency variation as a function of temperature. The piezoelectric resonator is of the cubic type and is capable of being produced by chemical etching a crystal substrate.

BACKGROUND OF THE INVENTION

A contour mode resonator takes the form of a thin slice of piezoelectric material and resonates within the plate of the slice of material. The thickness of the resonator must be sufficiently small so that inertial forces caused by any movements outside the plane of the slice have a negligible influence on the deformation energy thereof. The shape most usually adopted for the slice is rectangular, which entails the existence of four geometric parameters:

one or two cutting angles to define the direction perpendicular to the slice;
one cutting angle to define the orientation of the sides of the rectangle in the plane of the slice; and
the dimensions of the rectangle.

A known resonator, having good thermal properties and quasi-independence of the first order thermal coefficient from the dimensional ratio w/1, is the ZT-cut crystal resonator described in French patent No. 2,435,855. The ZT-cut described in this patent will hereinafter be referred to as the ZTY-cut. Such a resonator, whose basic shape is a rectangle, can also have a more complex structure through the combination of several base rectangles which, from the point of view of the propagation of elastic waves, can be considered to be pseudo-free rectangles. Examples of such combinations can be found in the aforesaid patent, as well as in French patent No. 2,521,782, describing embeddable resonator structures with a so-called ZTY-cut.

ZTY-cut resonators are obtained from a Z cut quartz crystal (that is to say a quartz crystal having the optical axis Z perpendicular to the plane of the crystal), followed by a first rotation about the mechanical axis Y of the crystal, followed by a second rotation about an axis perpendicular to the plane of the resonator.

A ZTX-cut crystal resonator is described in French patent application No. 88 09221. Such a resonator is produced in a thin rectangular slice of crystal, whose width is directed along the electrical axis X of the crystal, whose length is directed along an axis Y' and whose thickness is directed along an axis Z', the axes Y' and Z' forming with the mechanical Y and optical Z axes of the crystal, respectively, an angle $\phi$ equal approximately to 24° 24', and whose ratio w/1 of the width to the length is substantially equal to 0.64. When such a resonator is obtained by chemical etching of such a slice, it is easy to see that the lateral faces parallel to the axis Y' are in the favored plane of etching (the direction of the axis Z) and will, because of this, be exactly perpendicular to the large surfaces of the resonator.

The ZTX or ZTY-cut crystal resonators allow functioning in a range of frequencies below approximately 4 MHz. A resonator functioning in a higher range of frequencies can be obtained by a reduction of all the dimensions of the base structure of the resonator. Such a resonator would then require a slice thickness t of a value of approximately 30 $\mu$m, a value very much lower than the value which can be used in practice, which is around 100 $\mu$m.

The solution consisting of reducing the width w and the length 1 of the base structure of the resonator, while maintaining the thickness of the slice at an acceptable value, has the major disadvantage of increasing appreciably the impedance of the resonator.

SUMMARY OF THE INVENTION

An object of the present invention is to provide a ZTX or ZTY-cut crystal resonator having excellent properties while functioning in a range of higher frequencies.

Another object of the invention is a resonator whose suspension provides good elastic coupling between two adjacent slices.

Another object of the invention is a resonator whose suspension zone enables the structure of the resonator to be fixed outside its center.

Another object of the invention is a resonator having a plurality of base rectangles, arranged so as to enable it to be fixed to a case by embedding.

Other objects, characteristics and advantages of the present invention will appear more clearly from the following reading of particular examples of applications. The following description of the invention is made by way of non-limiting example and in relation to the accompanying drawings.

BRIEF DESCRIPTION OF THE DRAWINGS

FIGS. 1a and 1b show the orientation, with respect to the crystallographic axes X, Y and Z of the crystal, of a base element used in the structure according to the invention, in the case of ZTY cut and ZTX cut crystals respectively;

FIG. 2 is a view in perspective of the simple resonator using the base element of FIG. 1 and showing the positioning of the electrodes;

FIG. 3 shows a resonator obtained by the combination of three juxtaposed base elements.

DETAILED DESCRIPTION OF THE INVENTION

Figure 4:
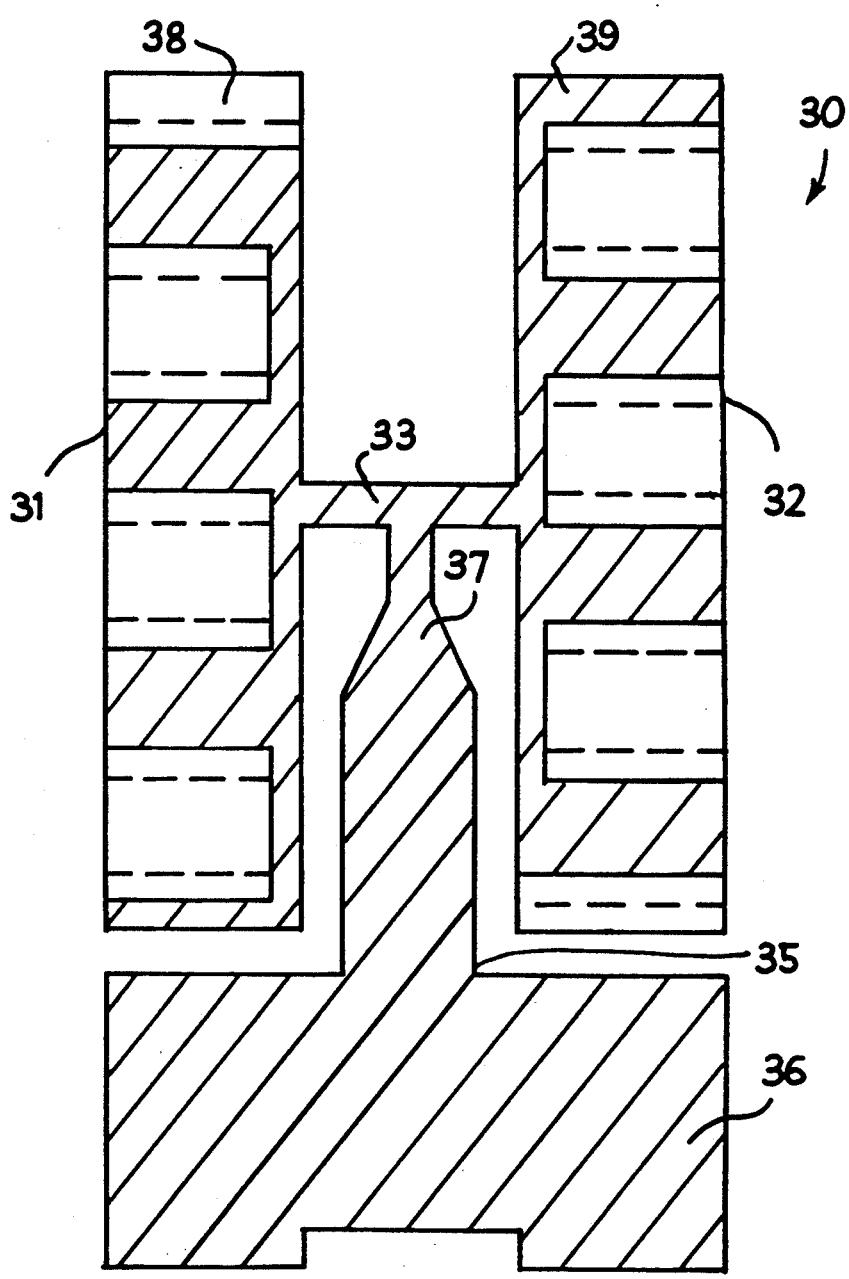
FIG. 4 shows an example of a resonator according to the invention with, a more complex shape, enabling it to be fixed to a case by embedding.

With reference to FIG. 1a, the slice referred to as the ZTY-cut slice, a cut described in French patent No. 2,435,855 is preferably obtained from a Z cut quartz crystal, that is to say a crystal having its optical axis Z perpendicular to the largest surface plane of the slice. A first rotation by an angle $\phi$ about the mechanical axis Y takes the optical axis Z to Z' and the electrical axis X to $X_1$. A second rotation by an angle $\Theta$ about the axis Z takes the axis $X_1$ to X' and the axis Y to Y'. The principal directions X', Y' and Z' correspond, respectively, to the length 1, the width w and the thickness t of the ZT cut slice. According to the IRE standards, "Standards on Piezoelectric Crystals, 1949", published in Proceedings of the I.R.E., Vol. 37, No. 12, December 1949, such a cut is denoted $(z \times w\ t)\phi$, $\Theta$. In order to fulfil the conditions set out above, the angles $\phi$ and $\Theta$ should be chosen such that $16° < \phi < 36°$, $10° < \Theta < 26°$ and the dimensional ratio w/1 such that w/1 is between 0.5 and 0.8. Preferably, should be approximately equal to 26°, $\Theta$ approximately equal to 20° and w/1 approximately equal to ⅔.

With reference to FIG. 1b, the slice referred to as a ZTX cut slice, a cut described in French patent application No. 88 09221, is preferably obtained from a ZY cut quartz crystal, the mechanical axis Y indicating the direction of the length of the slice. A rotation by an angle $\phi$ about the electrical axis X takes the axis Y to Y' and the axis Z to Z'. The principal directions X, Y' and Z' correspond, respectively, to the width w, the length l and the thickness t of the ZTX cut slice. According to the IRE standard (1949), such a cut is denoted (Z Y W)$\phi$. The resonator of the invention is then perfectly defined when the values of the angle $\phi$ and of the dimensional ratio of the width w to the length l of the resonator are specified. Preferably, the angle $\phi$ should be approximately equal to 24°24'±3° and the dimensional ratio w/1 approximately equal to 0.64 ±0.03.

It will be noted that the characteristic curve of the frequency variation as a function of the temperature is a cubic curve, whose point of inflection (second order thermal coefficient) can be adapted by an appropriate choice of the dimensional ratio. The value of the first order thermal coefficient $\alpha$, which represents the slot of the characteristic curve at the point of inflection, depends on the cutting angle $\phi$. The coefficient $\alpha$ can be eliminated or adjusted to a value close to zero according to the size of the temperature range in which the resonator has to have good thermal properties. In addition to the required adjustment of the cutting angle $\phi$ and the dimensional ratio w/1 for an adaptation to the chosen functioning conditions (typical operating temperature and temperature range), it is also necessary to compensate for certain perturbational effects which cannot be modelled. Account should be taken, in particular, of the effect of the metallizing (electrical, elastic and mass effects of the electrodes), of the suspension of the resonator (soldering of the suspension wires or suspension arms and embedding zones), of the non-zero value of the thickness of the resonator, of the manufacturing tolerances (obliqueness of some faces due to the chemical etching process), etc.

Consequently, it will be understood that the values of the cutting angle and dimensional ratio indicated above are typical values which can be departed from, from 1 to 3 degrees in the case of $\phi$ and 1 to 5% in the case of w/1, in order to optimize the resonator according to the application chosen. The width w and length l will be chosen as a function of the operating frequency. The frequency per unit of width is substantially equal to 2718 KHz/mm. The thickness t is, as in all contour mode resonators, a relatively free parameter which can be used to optimize the performance of the resonator of the invention.

FIG. 2 shows an example of a resonator fitted with electrodes. The electrodes 11 and 12 are obtained by partial metallization of the large faces of the resonator 10 and are symmetrical with each other with respect to the center of the resonator. The width of the metallization is determined as a function of the desired dynamic capacity. The polarization of the electrodes generates a diagonal electrical field making it possible to excite an extension mode along the direction indicated by the arrow 13.

FIG. 3 shows a first variant of a resonator which consists of a slice 20 which can be considered to be the combination of three base resonator structures, whose width w and length l are such that the ratio w/l is substantially equal to 0.64. The configuration of the electrodes 21, 22, 23 and 24 is also shown in the figure.

It should be noted that the variant in FIG. 3 constitutes only one example of a possible configuration, associating several base structures, and that, in a general way, a whole number N (or M) of base structures can be combined. Such a combination is carried out so that the direction of the movement is preserved, that is to say by juxtaposing the base structures along the large sides thereof.

While the variants shown in FIGS. 1 to 3 can be fixed to a case by means of suspension wires, fixed by soldering, at the center of the large faces of the resonators, the variant in FIG. 4 can be fixed to a case by means of a suspension arm, attached to the resonator and incorporating an embedding zone and a connection zone.

FIG. 4 shows a resonator 30, which incorporates two rectangular slices 31 and 32, connected by an arm 33. The arm 33 is connected to a suspension arm 35, which consists successively of an embedding zone 36 and a connection zone 37, which may, for example, be conical. The metallization of the electrodes 38 and 39 is represented by a hatched area, in the case of one of the faces of the slices, and by a dotted outline in the case of the other face of the slices.

In a preferred embodiment shown in FIG. 4, the resonator incorporates two rectangular slices each consisting of seven base structures juxtaposed along their large sides. The arm connecting the slices is disposed in the middle of the slices and more particularly connects two base structures. In the preferred embodiment, the two base structures opposite each other vibrate in antiphase. It is possible, however, to distribute the metallizations on the electrodes so that the two base structures opposite each other vibrate in phase.

In accordance with the invention, the two rectangular parallelepipedal slices are disposed alongside each other in the same plane. The electrodes are disposed and polarized to excite preferentially one of the harmonics (i.e., the Nth harmonic) of the fundamental contour vibration mode of a base structure. The contour mode is an extension mode in the direction of the length of said spices. The extension modes of each of the rectangular parallelepipedal slices are produced in a direction perpendicular to the axis of the arm connecting the slices. The arm connecting the slices is a non-resonant arm which is connected to the embedding zone by the connection zone, so as to enable the structure of the resonator to be fixed outside its center.

Although the present invention has been described within the framework of particular examples, it is clear that it is not limited to those examples and that it is capable of modifications and variants without departing from its scope as defined in the appended claims. The possibility, in particular, of combining even and/or odd numbers of base structures, for example, so that the two slices facing each other are offset with respect to each other, the arm connecting the slices being positioned or not in the middle of one and/or the other slice, allows a plurality of variants to be envisioned other than those described in the description.

What is claimed is:

1. A piezoelectric resonator, comprising:
   two rectangular parallelepipedal slices comprising N and M base structures, respectively, wherein N and M are integers, said two rectangular parallelepipedal slices each comprising at least one base structure shaped as a thin crystal slice of piezoelectric material in the form of a rectangular parallelepiped having a width w directed along an electrical axis X of the crystal slice, a length l directed along an axis Y' of the crystal slice, and a thickness t directed along an axis Z' of the crystal slice, said axes Y' and Z' forming with a mechanical Y and optical Z axes of the crystal slice, respectively, an angle $\phi$ equal to 24°24'±3°, and a ratio w/l of said width to said length is equal to N(0.64±0.03) or M(0.64±0.03);

a non-resonant arm connecting said two rectangular parallelepipedal slices in juxtaposition in a single plane;

an embedding zone connected to said arm through a connection zone to fix said resonator outside a center thereof; and a plurality of electrodes disposed on opposite surfaces of said two rectangular parallelepipedal slices, said electrodes being polarized to excite preferentially the Nth harmonic of a fundamental contour vibration mode in each said base structure and to produce respective extension modes in said two rectangular parallelepipedal slices in a direction perpendicular to an axis of said non-resonant arm.

2. A piezoelectric resonator, comprising:

two rectangular parallelepipedal slices comprising N and M base structures, respectively, wherein N and M are integers, said two rectangular parallelepipedal slices each comprising at least one base structure shaped as a thin crystal slice of piezoelectric material in the form of a rectangular parallelepiped having its largest opposed surfaces arranged in a plane of said crystal slice, each base structure having a width w oriented along an axis Y' of the crystal slice, a length l oriented along an axis X' of the crystal slice, and a thickness t oriented along an axis Z' of the crystal slice, said axis Z' being perpendicular to said plane of said crystal slice, being arranged in a plane containing the electrical X and optical Z axes of said crystal slice, and forming an angle $\phi$ with said optical Z axis between 16° and 36°, said axis Y' forming an angle $\Theta$ with a mechanical axis Y of said crystal slice between 10° and 30°;

a non-resonant arm connecting said two rectangular parallelepipedal slices in juxtaposition in a single plane;

an embedding zone connected to said arm through a connection zone to fix said resonator outside a center thereof; and a plurality of electrodes disposed on opposite surfaces of said two rectangular parallelepipedal slices, said electrodes being polarized to excite preferentially the Nth harmonic of a fundamental contour vibration mode in each said base structure and to produce respective extension modes in said two rectangular parallelepipedal slices in a direction perpendicular to an axis of said non-resonant arm.

* * * * *